United States Patent
Lee et al.

(10) Patent No.: US 8,809,149 B2
(45) Date of Patent: Aug. 19, 2014

(54) HIGH DENSITY SERIAL CAPACITOR DEVICE AND METHODS OF MAKING SUCH A CAPACITOR DEVICE

(71) Applicant: GLOBALFOUNDRIES Inc., Grand Cayman, KY (US)

(72) Inventors: Ki Young Lee, Poughquag, NY (US); Sanggil Bae, Clifton Park, NY (US); Tony Joung, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 26 days.

(21) Appl. No.: 13/712,234

(22) Filed: Dec. 12, 2012

(65) Prior Publication Data
US 2014/0159199 A1  Jun. 12, 2014

(51) Int. Cl.
*H01L 21/336* (2006.01)
*H01L 29/788* (2006.01)

(52) U.S. Cl.
USPC .......................................... 438/283; 257/320

(58) Field of Classification Search
USPC .......... 438/157, 253, 283, 396; 257/306, 320, 257/E21.458, E21.624
See application file for complete search history.

(56) References Cited

U.S. PATENT DOCUMENTS

| | | |
|---|---|---|
| 5,576,240 A | 11/1996 | Radosevich et al. |
| 5,918,135 A | 6/1999 | Lee et al. |
| 6,166,423 A | 12/2000 | Gambino et al. |
| 6,333,224 B1 | 12/2001 | Lee |
| 6,461,914 B1 | 10/2002 | Roberts et al. |
| 6,479,850 B2 | 11/2002 | Lee |
| 6,633,497 B2 | 10/2003 | Nickel |
| 6,649,464 B2 | 11/2003 | Lee |
| 6,783,999 B1 | 8/2004 | Lee |
| 6,806,096 B1 | 10/2004 | Kim et al. |
| 6,853,003 B2 | 2/2005 | Lee |
| 6,881,999 B2 | 4/2005 | Lee et al. |
| 7,084,024 B2 | 8/2006 | Gluschenkov et al. |
| 7,101,804 B2 | 9/2006 | Choi et al. |
| 7,154,162 B2 * | 12/2006 | Ahn et al. .................... 257/532 |
| 7,232,736 B2 | 6/2007 | Lee |
| 7,262,065 B2 | 8/2007 | Mitsui et al. |
| 7,285,490 B2 | 10/2007 | Barth et al. |
| 7,462,535 B2 | 12/2008 | Lee et al. |
| 7,465,604 B2 | 12/2008 | Heo |
| 7,575,984 B2 | 8/2009 | Radigan et al. |
| 7,615,460 B2 | 11/2009 | Ueda |
| 7,692,199 B2 * | 4/2010 | Arai ............................... 257/79 |
| 7,755,196 B2 | 7/2010 | Barth et al. |
| 7,989,224 B2 | 8/2011 | Gaidis |
| 8,581,255 B2 * | 11/2013 | Wei et al. ...................... 257/59 |
| 2004/0108134 A1 * | 6/2004 | Borland et al. .............. 174/260 |

\* cited by examiner

*Primary Examiner* — Calvin Lee
(74) *Attorney, Agent, or Firm* — Amerson Law Firm, PLLC (57) ABSTRACT

A serial capacitor comprised of a bottom electrode, a top electrode that is conductively coupled the bottom electrode, a middle electrode positioned between the bottom and top electrode, a lower dielectric layer positioned between the bottom and middle electrodes, and an upper dielectric layer positioned between the middle and the electrodes. A method includes forming the bottom electrode in a first layer of insulating material, forming the lower dielectric layer and the middle electrode above the bottom electrode, wherein the middle electrode is positioned in a second layer of insulating material, forming the upper dielectric layer above the middle electrode, forming an opening that exposes a portion of the bottom electrode, and forming the top electrode above the upper dielectric layer, wherein a portion of the top electrode extends through the opening and contacts the bottom electrode.

21 Claims, 9 Drawing Sheets

HIGH DENSITY SERIAL CAPACITOR DEVICE AND METHODS OF MAKING SUCH A CAPACITOR DEVICE

BACKGROUND OF THE INVENTION

1. Field of the Invention

Generally, the present disclosure relates to the manufacture of sophisticated semiconductor devices, and, more specifically, to a high density serial capacitor device and methods of making such a capacitor device.

2. Description of the Related Art

In addition to the large number of transistor elements, a plurality of passive circuit elements, such as capacitors, are typically formed in integrated circuits that are used for a plurality of purposes, such as charge storage for storing information, for decoupling and the like. Decoupling in integrated circuits is an important aspect for reducing the switching noise of the fast switching transistors, since the decoupling capacitor may provide energy at a specific point of the circuitry, for instance at the vicinity of a fast switching transistor, and thus reduce voltage variations caused by the high transient currents which may otherwise unduly affect the logic state represented by the transistor.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated microcontroller devices and other sophisticated devices, an increasing amount of storage capacity may be provided on chip with the CPU core, thereby also significantly enhancing the overall performance of modern computer devices. For example, in typical micro-controller designs, different types of storage devices may be incorporated so as to provide an acceptable compromise between die area consumption and information storage density versus operating speed. For example, static RAM memories may be formed on the basis of registers, thereby enabling an access time determined by the switching speed of the corresponding transistors in the registers. Typically, a plurality of transistors may be required to implement a corresponding static RAM cell, thereby significantly reducing the information storage density compared to, for instance, dynamic RAM (DRAM) memories including a storage capacitor in combination with a pass transistor. Thus, a higher information storage density may be achieved with DRAMs, although at a reduced access time compared to static RAMs, which may nevertheless render dynamic RAMs attractive in complex semiconductor devices.

Complex integrated circuit devices typically include a memory array, such as an embedded DRAM array, and other non-memory circuits, e.g., logic circuits (such as microprocessors), located outside of the memory array. One problem associated with manufacturing such complex devices is that some designers and manufacturing engineers tend to treat the regions outside the memory array and the memory array itself as completely separate items, each with their own unique design rules and process flows. As a result, in some cases, manufacturing such complex devices is not as cost-effective or efficient as it could be. For example, by independently focusing on one region to the exclusion of the other, additional manufacturing operations may be performed only in that one region, which tends to require additional manufacturing time, makes the resulting device more costly, and may lead to decreased product yields.

In recent years, as the integration density of semiconductor devices increases, the area occupied by individual devices continues to decrease. Specifically, a capacitor for storing data of a dynamic random access memory (DRAM) is required to have sufficient capacitance irrespective of the decrease in the area occupied by the capacitor. Accordingly, metal-insulator-metal (MIM) capacitors, in which a lower electrode and an upper electrode are formed of metal and separated by a layer of insulating material, have been used in many integrated circuit products. Additionally, MIM capacitors have been used extensively in semiconductor devices that perform analog-to-digital conversions and digital-to-analog conversions. Conversion between analog signals and digital signals requires that capacitors employed in such conversion processes be stable, i.e., the capacitance of the capacitor must be relatively stable over a range of applied voltages and temperatures. The capacitance of capacitors with polysilicon electrodes tends to be relatively unstable as the capacitance of such capacitor structures tends to vary with changes in temperature and applied voltage. Accordingly, capacitors with polysilicon electrodes are typically not used for such conversion applications.

In forming the upper and lower metal electrodes of a typical MIM capacitor, an etching process is typically performed to pattern a metal layer. However, as the integration density of semiconductor devices has increased over the recent years, it has become more difficult to etch such metal layers. In particular, copper, which has good electromigration resistance and a desirable low resistivity, is very difficult to etch. Accordingly, various methods for forming the upper and lower metal electrodes through a damascene process, a process which does not involve etching a metal layer, has been proposed. See, for example, U.S. Pat. No. 6,649,464. A copper damascene process generally comprises forming a trench for a copper structure in an insulation layer, forming a sufficient amount of copper to overfill the trench, and removing the excess copper from the substrate, thereby leaving the copper structure in the trench. However, the damascene process used in forming copper-based capacitors and conductive lines and vias is a very time-consuming, expensive, multiple step process where chances for creating undesirable defects always exists.

As noted above, it is not uncommon for a typical integrated circuit product to contain separate regions or areas where logic circuits and circuits requiring capacitors (memory circuits) are formed. As device dimensions have continued to shrink, the area or plot space allotted for forming conductive contact structures and metal lines and vias has continued to decrease as well. In some cases, in so-called "back-end-of-line" processing, metal hard mask layers are employed as etch masks instead of traditional photoresist masks so as to increase etch selectivity between the etch mask and the dielectric material and to enable the more accurate formation of openings for conductive structures, like conductive vias formed using a damascene process.

The present disclosure is directed to a high density serial capacitor device and methods of making such a capacitor device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a high density serial capacitor device and methods of making such a capacitor device. In one illustrative embodiment, the serial capacitor includes a bottom electrode, a top electrode positioned above the bottom electrode, wherein the top electrode and bottom electrodes are conductively coupled to one another, a middle electrode positioned between the bottom and top electrode, a lower dielectric layer positioned between the bottom electrode and the middle electrode, and an upper dielectric layer positioned between the middle electrode and the top electrode.

One illustrative method of forming a serial capacitor that is disclosed herein includes forming a bottom electrode of the capacitor in a first layer of insulating material, forming a lower dielectric layer of the capacitor above the bottom electrode, forming a middle electrode of the capacitor above the bottom electrode, wherein the middle electrode is positioned in a second layer of insulating material that is positioned above the first layer of insulating material, forming an upper dielectric layer of the capacitor above the middle electrode, performing an etching process to define at least one opening that exposes a portion of the bottom electrode, and forming a top electrode of the capacitor above the upper dielectric layer, wherein a portion of the top electrode extends through the at least one opening and is conductively coupled to the exposed portion of the bottom electrode.

Another illustrative method disclosed herein includes forming a first conductive structure and a bottom electrode of a capacitor in a first layer of insulating material, wherein the first conductive structure and the bottom electrode are laterally spaced apart from one another in the first layer of insulating material, forming a middle electrode of the capacitor above the bottom electrode, wherein the middle electrode is positioned in a second layer of insulating material that is positioned above the first layer of insulating material, and forming an upper dielectric layer of the capacitor above the middle electrode and above the second layer of insulating material. In this embodiment, the method includes the additional steps of forming a layer of conductive material above the upper dielectric layer, performing an etching process on the layer of conductive material to define a conductive material hard mask and a top electrode for the capacitor, wherein the conductive material hard mask is positioned above at least a portion of the first conductive structure and the top electrode is positioned above the middle electrode, forming an opening in the conductive material hard mask, performing an etching process through the conductive material hard mask on the second layer of insulating material to define a trench in the second layer of insulating material, and forming a second conductive structure that conductively contacts the first conductive structure, wherein at least a portion of the second conductive structure is at least partially positioned in the trench.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1A:
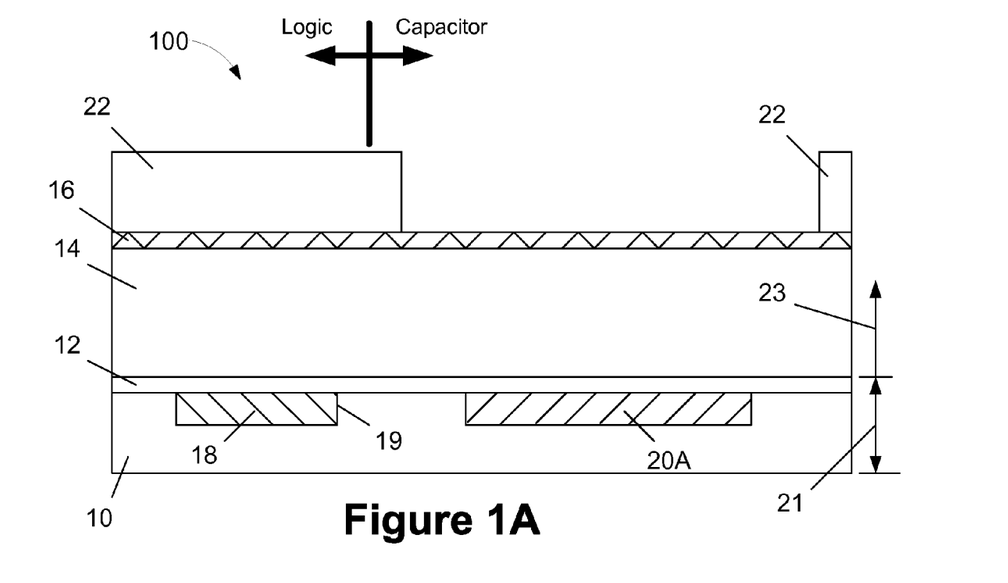
FIGS. 1A-1P depict various illustrative methods of forming one illustrative embodiment of a high density serial capacitor device described herein.

The present disclosure is directed to a high density serial capacitor device and methods of making such a capacitor device. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 1A-1P, various illustrative embodiments of the certain methods and certain devices disclosed herein will now be described in more detail.

FIG. 1A is a simplified view of a portion of an illustrative semiconductor device or product 100 at an early stage of manufacturing. The device 100 is formed above a semiconducting substrate (not shown). At the point of fabrication depicted in FIG. 1A, the device 100 includes an illustrative first insulating layer 10, a non-conductive diffusion barrier layer 12, a second insulating layer 14, a hard mask layer 16, a patterned mask layer 22, a conductive structure 18, e.g., a conductive line, and a bottom electrode 20A of what will become a serial capacitor. The conductive structures 18, 20A are physically spaced apart in the first insulating layer 10. The layers 10, 12 and the conductive structures 18, 20A are part of a first metallization layer 21, while the other materials shown in FIG. 1A will become part of a second metallization layer 23. The layer 12 is the uppermost barrier layer of the first metallization layer 21. The metallization layers 21, 23 are intended to be representative in nature as they may be at any level of the device 100. For example, the metallization layer 21 may be the so-called "contact" or "CA" layer or it may be the so-called "metal-1" or "M1" that constitutes the first level of the general wiring circuits for the device 100. As a specific example, the metallization layer 21 may be the CA layer, while the metallization layer 23 may be the M1 layer. As another example, the metallization layer 21 may be the third general metallization layer of the device 100, while the metallization layer 23 may be the fourth general metallization layer of the device 100. Of course, the device may have any desired number of metallization layers. Thus, when reference is made herein to any metallization layer, it should be understood that such layer may be at any level in an integrated circuit product, and that the novel devices disclosed herein may be formed at any level of an integrated circuit product.

The various layers depicted in FIG. 1A may be formed from a variety of different materials, and they may be formed by performing a variety of techniques, such as a chemical vapor deposition (CVD), atomic layer deposition (ALD), physical vapor deposition (PVD) or plasma enhanced versions of such processes. The thickness of such layers may also vary depending upon the particular application. For example, in one illustrative embodiment, the first insulating layer 10 may be comprised of a material such as silicon dioxide, silicon oxynitride, low-k silicon dioxide, a low-k material (k value less than 2.7), etc. In one specific example, the first insulating layer 10 may be a layer of silicon dioxide having a thickness of about 400-600 nm that is initially formed by performing a CVD process. As another example, in one illustrative embodiment, the non-conductive diffusion barrier layer 12 may be comprised of a material, such as silicon nitride, NBLoK™, silicon carbon nitride, a nitrogen-doped silicon carbide, etc., that will help prevent or at least reduce any undesirable migration of the conductive materials in the conductive structure 18 and/or the bottom electrode 20A. In one specific example, the non-conductive diffusion barrier layer 12 may be a layer of NBLoK™ having a thickness of about 20-40 nm that is initially formed by performing a CVD process.

Continuing with the discussion of FIG. 1A, in one illustrative embodiment, the second insulating layer 14 may be comprised of a material such as a so-called low-k insulating material (k value less than 2.7), an ultra-low-k insulating material (k value of less than 2.3), silicon dioxide, OMCTS (Octamethyleyelotetrasiloxane) oxide film, etc. In one specific example, the second insulating layer 14 may be a layer of a low-k insulating material having a thickness of about 700-1000 nm that is initially formed by performing a CVD process. In one illustrative embodiment, the hard mask layer 16 may be comprised of a variety of materials such as, for example, a TEOS-based silicon dioxide, silicon nitride, etc. In one specific example, the hard mask layer 16 may be a layer of TEOS-based silicon dioxide having a thickness of about 30-40 nm that is initially formed by performing a CVD process. Among other things, the hard mask layer 16 acts to protect the underlying second layer of insulating material 14. The patterned mask layer 22 may be comprised of a variety of material, e.g., a photoresist material, and it may be formed using known photolithography techniques.

Still referring to FIG. 1A, the schematically depicted conductive structure 18 may be comprised of a variety of conductive materials, such as copper, copper manganese, silver, etc., and it may be formed using a variety of known techniques. In one specific example, the conductive structure 18 is a copper line that is formed using known damascene techniques. The conductive structure 18 may be part of the overall metallization system for the device 100. Of course, the size, shape and configuration of the conductive structure 18 may vary depending upon the particular application. In one specific example, the conductive structure 18 may have a thickness that ranges from about 40-60 nm. So as not to obscure the present inventions, various details and layers associated with the formation of the conductive structure 18 are not depicted in the drawings. For example, one or more barrier layers (not shown) are typically formed in the trench 19 prior to depositing the conductive material, e.g., copper in the trench 19. Similarly, the bottom electrode 20A may be comprised of a variety of conductive materials, such as copper, copper manganese, silver, etc., and it may be formed using a variety of techniques. The thickness of the bottom electrode 20A may also vary depending upon the particular application. In one illustrative embodiment, the bottom electrode 20A may be comprised of copper, it may be formed using known damascene techniques, and it may have a thickness of about 40-60 nm. The lateral width of the bottom electrode 20A may also vary depending upon the particular application. Any barrier layers that may be formed as part of the process of forming the bottom electrode 20A are not depicted in FIG. 1A so as not to obscure the present inventions.

Figure 1B:
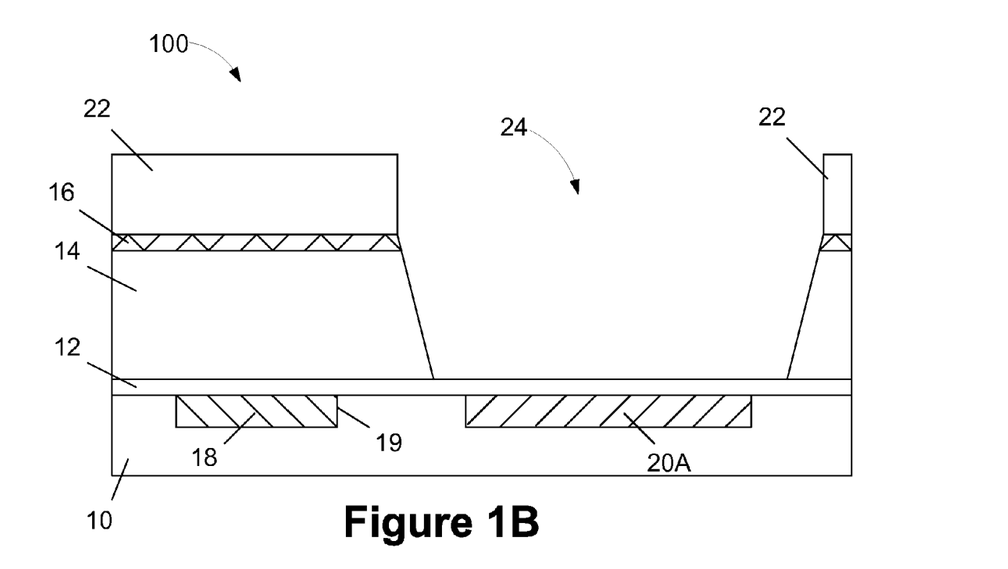

Next, as shown in FIG. 1B, one or more etching processes are performed through the patterned mask layer 22 to define the opening 24. Either dry or wet etching processes may be employed in forming the opening 24. In one illustrative embodiment, the opening 24 is formed by performing dry anisotropic etching processes to define the opening 24, with appropriate changes in the etch chemistry of such etching processes as may be required to etch through the hard mask layer 16 and the second layer of insulating material 14. The size and configuration of the opening 24 may vary depending upon the particular application.

Figure 1C:
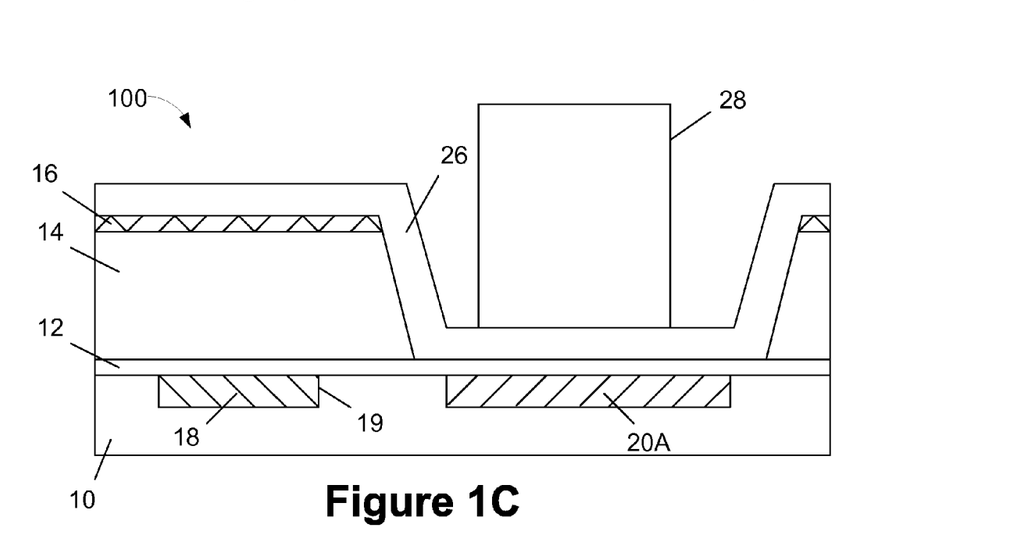

Next, as shown in FIG. 1C, a conductive material layer 26 is formed above the device 100 and in the opening 24. As will be described more fully below, a portion of the conductive material layer 26 will eventually become the middle electrode for the serial capacitor to be formed on the device 100. The conductive material layer 26 may be comprised of a variety of different materials or metals that may be suitable as an electrode for the MIM capacitor such as, for example, titanium, titanium nitride, tantalum, tantalum nitride, etc. In one specific example, the conductive material layer 26 may be a layer of titanium nitride having a thickness of about 30-50 nm that is initially formed by performing a conformal PVD or CVD process. Thereafter, another patterned mask layer 28, e.g., a photoresist mask, is formed above the conductive material layer 26.

Figure 1D:
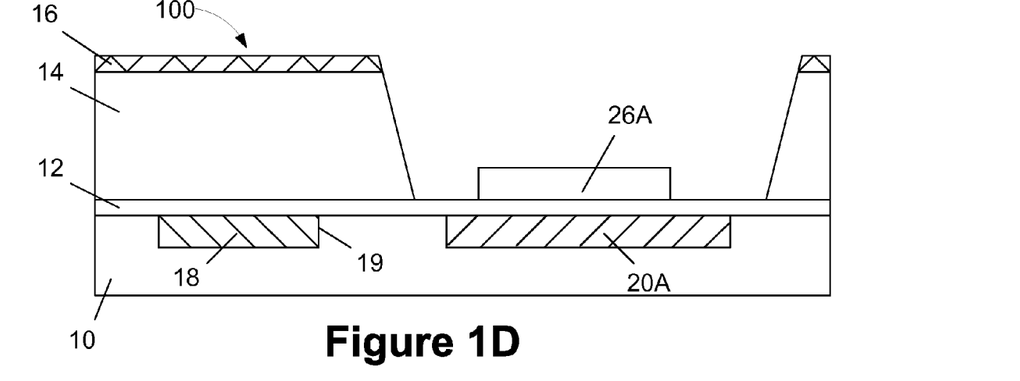

Next, as shown in FIG. 1D, one or more etching processes are performed on the conductive material layer 26 through the patterned mask layer 28 to define the middle electrode 26A for the serial capacitor. Either dry or wet etching processes may be employed in etching the conductive material layer 26. In one illustrative embodiment, the conductive material layer 26 is etched by performing a dry anisotropic etching process. The size and configuration of the middle electrode 26A may vary depending upon the particular application. FIG. 1D depicts the device 100 after the patterned mask layer 28 has been removed.

Figure 1E:
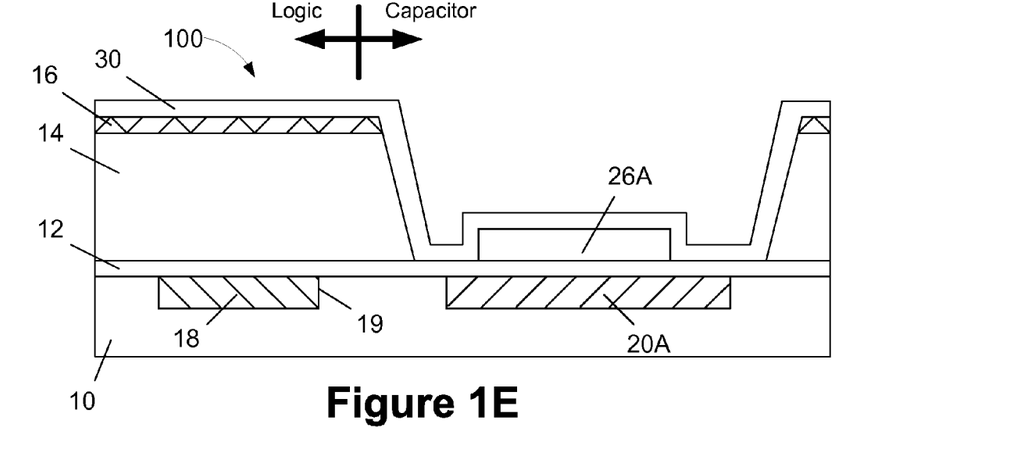

Then, as shown in FIG. 1E, a layer of insulating material 30 is conformally deposited above the device 100. In one illustrative embodiment, the layer of insulating material 30 may be comprised of a variety of materials such as, for example, a TEOS-based silicon dioxide, silicon nitride, etc. In one specific example, the layer of insulating material 30 may be a layer of TEOS-based silicon dioxide having a thickness of about 30-40 nm that is initially formed by performing a CVD process. In general, within logic circuits of the device 100, the layer of insulating material 30 may serve as a hard mask layer, while within the capacitor sections of the device 100, portions of the layer of insulating material 30 will serve as the dielectric layer between the middle electrode 26A and an upper or top electrode of the serial capacitor that is yet to be formed. It should also be noted that, so as to serve its hard mask function in the logic region, the layer of insulating material 30 may be made of a material such that it exhibits an increased hardness relative to the hardness of the hard mask layer 16.

Figure 1F:
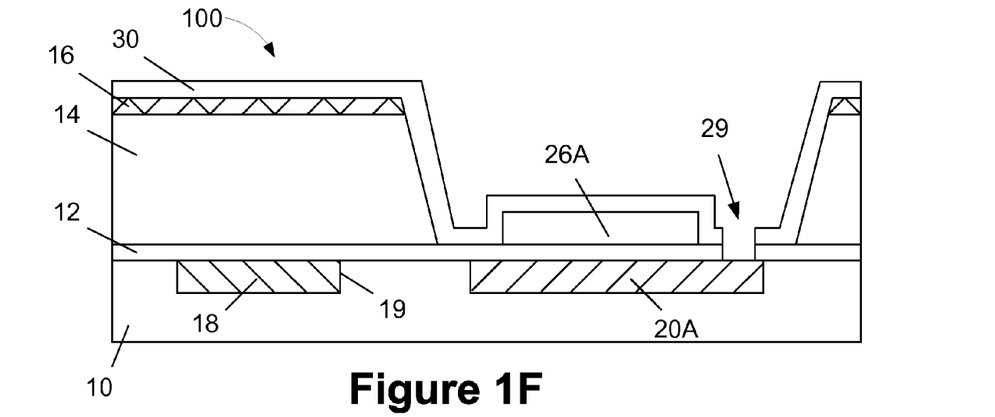

FIG. 1F depicts the device 100 after one or more etching processes have been performed though a patterned etch mask (not shown), e.g., a patterned photoresist mask, to define one or more contact openings 29 that expose portions of the bottom electrode 20A. In one illustrative embodiment, the contact opening(s) 29 may be formed by performing one or more anisotropic etching processes. The number and shape of the contact opening(s) 29A may vary depending upon the application, e.g., there may be a plurality of discreet openings or it may be one continuous line-type opening.

Figure 1G:
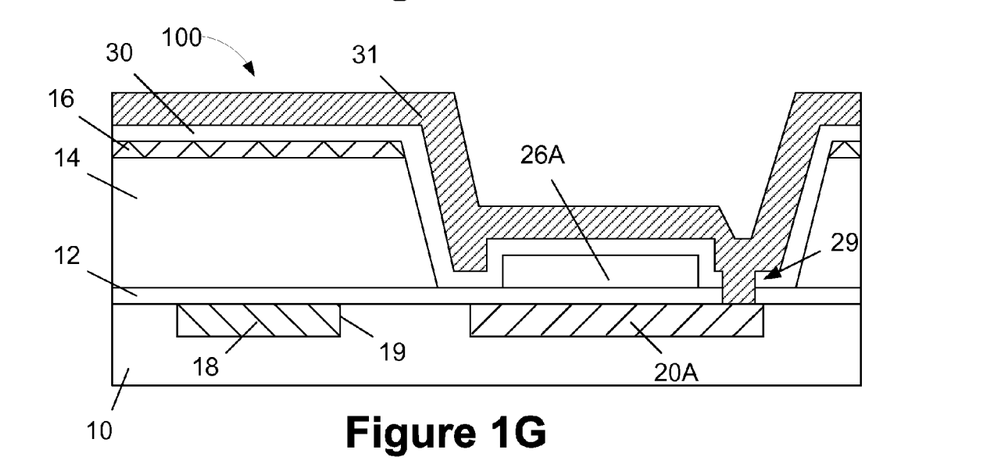

Next, as shown in FIG. 1G, a conductive material layer 31 is formed above the device 100 and in the opening(s) 29. As will be described more fully below, a portion of the conductive material layer 31 will eventually become the top electrode for the serial capacitor to be formed on the device 100. The conductive material layer 31 may be comprised of a variety of different materials that may be suitable as an electrode for the MIM capacitor such as, for example, titanium, titanium nitride, tantalum, tantalum nitride, etc. In one specific example, the conductive material layer 31 may be a layer of titanium nitride having a thickness of about 30-50 nm that is initially formed by performing a conformal PVD or CVD process.

Figure 1H:
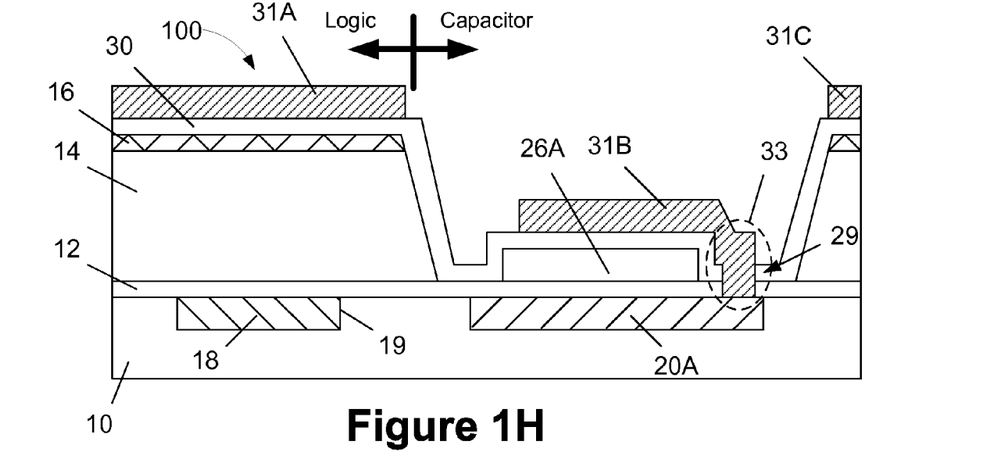
Figure 1I:
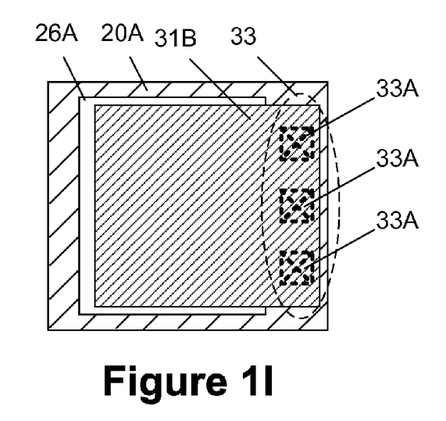
Figure 1J:
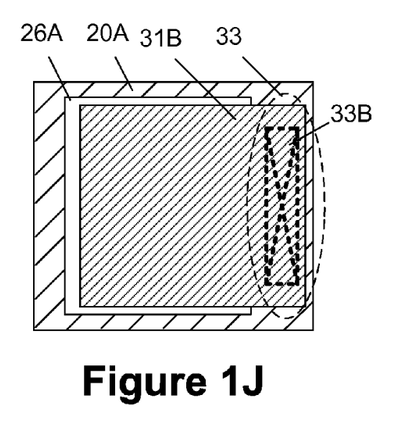

FIG. 1H depicts the device 100 after one or more etching processes have been performed on the conductive material layer 31 through another patterned mask layer (not shown), e.g., a photoresist mask, to define the top electrode 31B for the serial capacitor. The etching processes also result in the formation of metal hard mask layers 31A, 31C in regions remote from the capacitor region, i.e., in the logic regions. Either dry or wet etching processes may be employed in etching the conductive material layer 31. In one illustrative embodiment, the conductive material layer 31 is etched by performing a dry anisotropic etching process. The size and configuration of the top electrode 31B may vary depending upon the particular application. The process depicted in FIG. 1H also results in a portion of the top electrode 31B forming conductive structures 33 in the opening(s) 29 that conductively couple the top electrode 31B to the bottom electrode 20A. As mentioned previously, the conductive structures 33 may have a variety of different configurations. FIGS. 1I and 1J are plan views of the serial capacitor wherein cross-hatching has been maintained in an effort to facilitate a better understanding of the structure. As can be seen in FIG. 1I, the conductive structures 33 may be a plurality of individual or discreet contacts 33A (depicted in dashed lines), or, as shown in FIG. 1J, the conductive structure 33 may be a simple line-type feature 33B. Of course, if desired, the conductive features 33 may be a combination of discreet features 33A and continuous features 33B.

Figure 1K:
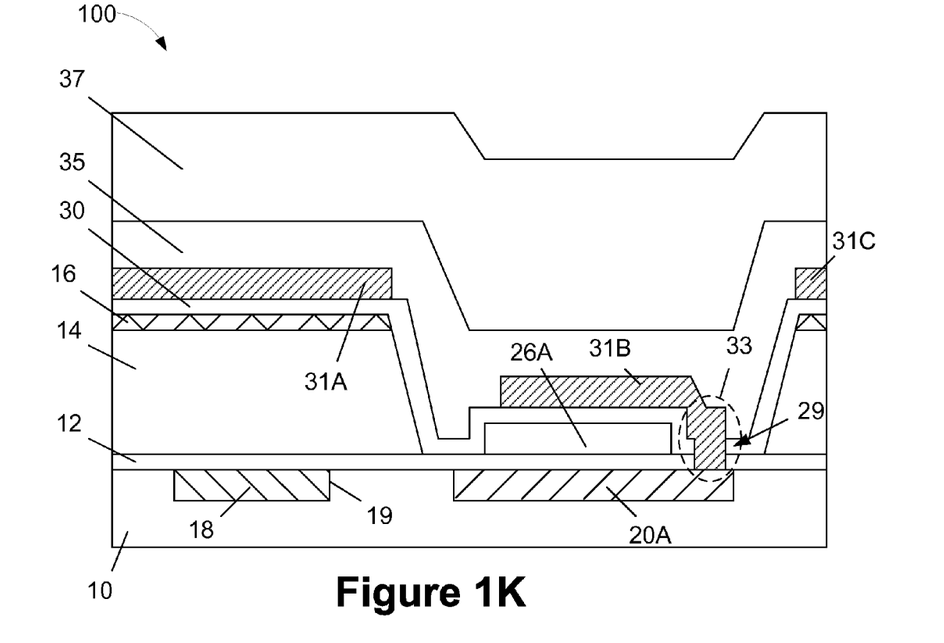

Then, as shown in FIG. 1K, a layer of insulating material 35 is conformally deposited above the device 100. In one illustrative embodiment, the layer of insulating material 35 may be comprised of a variety of materials such as those described above with respect to the layer of material 30. In one specific example, the layer of insulating material 35 may be a layer of TEOS-based silicon dioxide having a thickness of about 60-90 nm that is initially formed by performing a CVD process. The layer of insulating material 35 is typically a little thicker than the layer 30 as portions of the layer of insulating material 35 will be consumed in a subsequent CMP process as described more fully below. Also depicted in FIG. 1K is a layer of insulating material 37 that has been blanket-deposited across the device 100. The layer of insulating material 37 may be made of the same materials as those described above for the layer of insulating materials 10, 14.

Figure 1L:
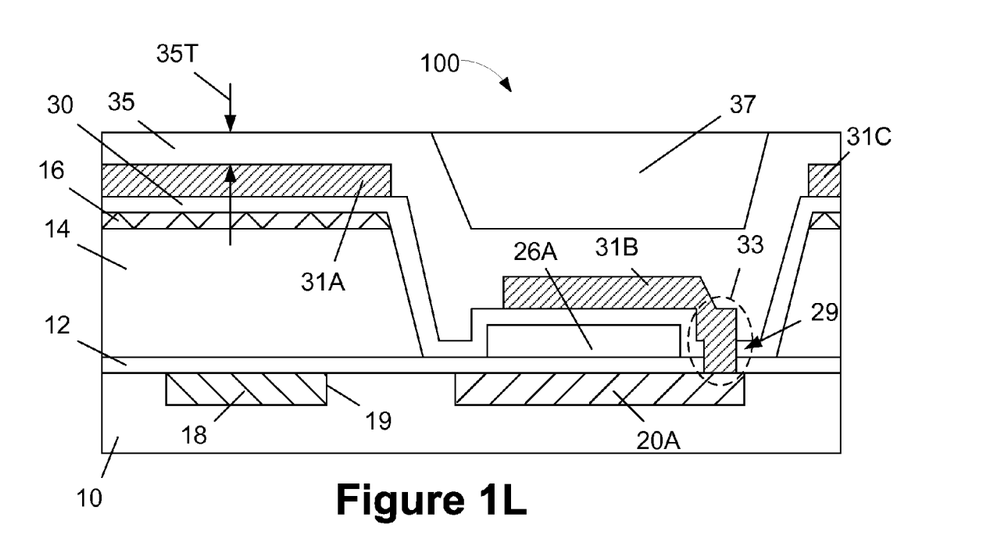

Next, as shown in FIG. 1L, one or more process operations are performed to remove portions of the layers of insulating material 37, 35 as part of the process operations that will be eventually performed to form a conductive contact to the conductive structure 18. In one illustrative embodiment, a chemical mechanical polishing (CMP) process is performed to remove portions of the layers 35, 37. In other applications, an etching process may be performed to remove the desired portions of the layers 35, 37. In one embodiment, the remaining thickness 35T of the layer 35 after its thickness has been reduced may be about 20-70 nm. The thickness 35T corresponds approximately to a depth of a trench to be formed below this reduced thickness layer 35 in the layer of insulating material 14 in a process operation to be more fully described below. Of course, if desired, a combination of a CMP process and an etching process may be employed in removing the desired portions of the layers of insulating material 35, 37.

Figure 1M:
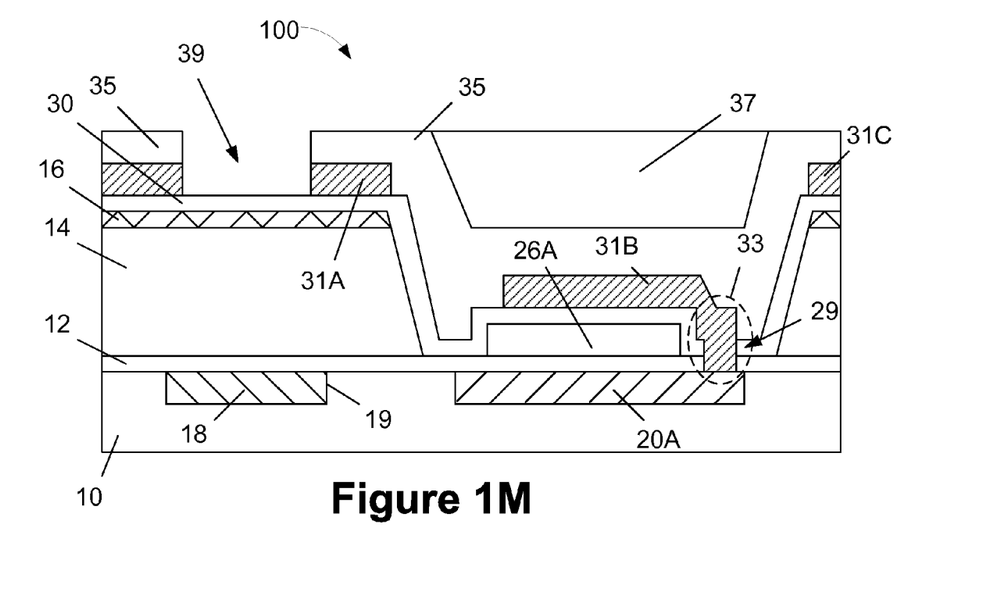

FIG. 1M depicts the device 100 after one or more etching processes have been performed on the layer of insulating material 35 and the hard mask layer 31A through another patterned mask layer (not shown), e.g., a photoresist mask, to define an opening 39.

Figure 1N:
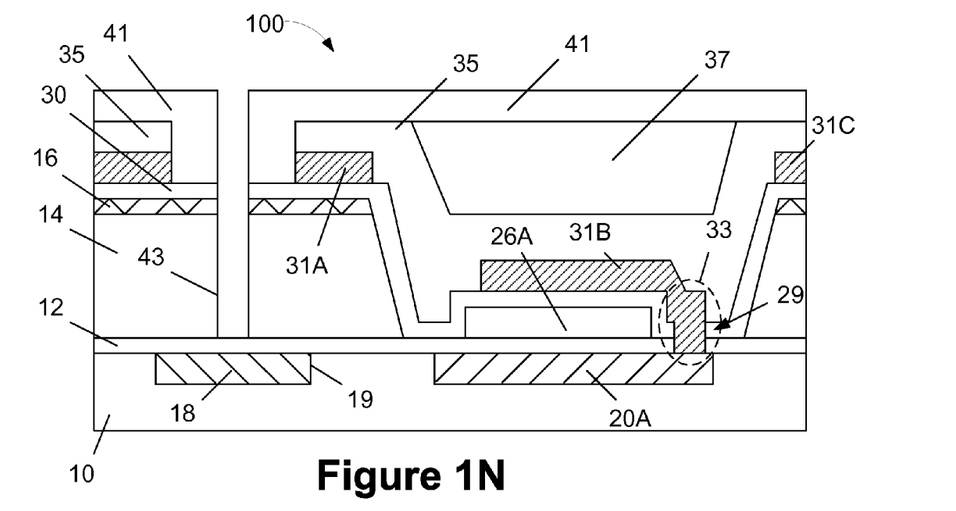
Figure 1O:
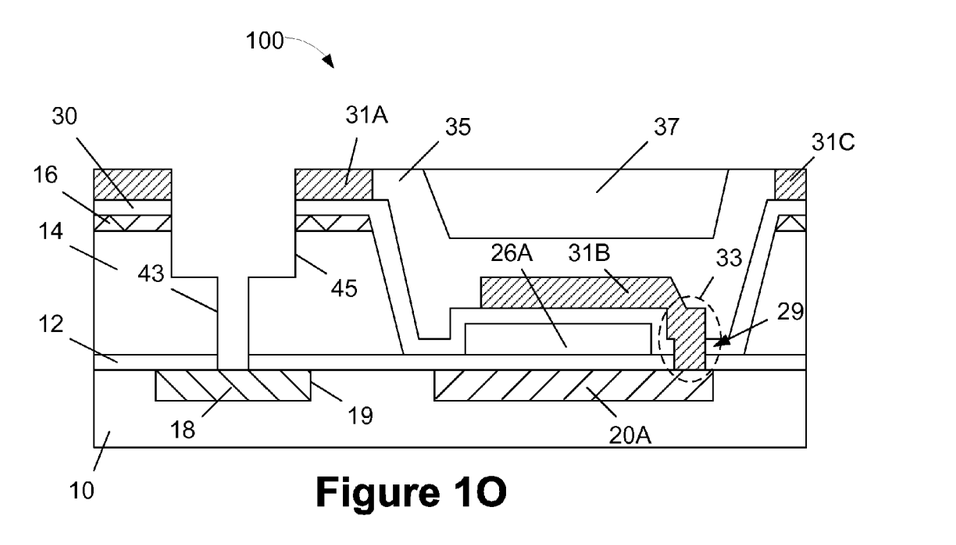
Figure 1P:
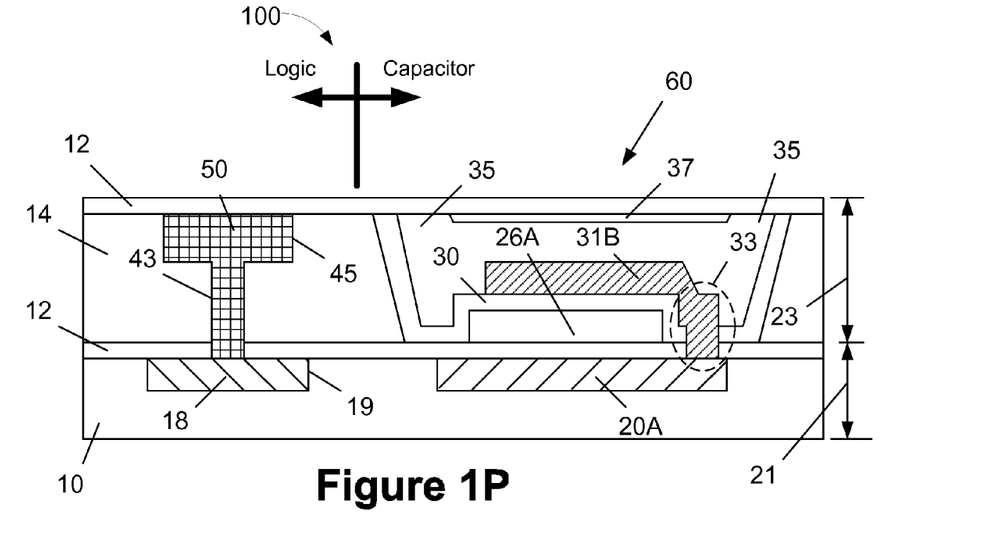

Next, as shown in FIGS. 1N-1P, a plurality of process operations are performed to form what will become a conductive structure 50 (see FIG. 1P) that will be electrically coupled to the conductive structure 18, e.g., a metal line, positioned in the first layer of insulating material 10. The conductive structure 50 may be comprised of a variety of different materials, e.g., copper, a metal, copper manganese, silver, etc., and it may be formed using a variety of known techniques. Thus, the particular material used for the conductive structure 50 and the manner in which it is formed should not be considered to be a limitation of the present inventions. In one illustrative embodiment, the conductive structure 50 may be comprised of copper and it may be formed by using known damascene processing techniques, such as those shown in U.S. Pat. No. 6,649,464. In general, as noted previously, copper damascene processing generally comprises forming a trench for a copper structure in an insulation layer, forming a sufficient amount of copper to overfill the trench, and removing the excess copper from the substrate, thereby leaving the copper structure in the trench. In the example depicted herein, the conductive structure 50 is formed using a so-called via-first, trench-last technique. Using this technique, a patterned mask layer 41, e.g., a patterned layer of photoresist, is formed above the device 100 and one or more etching processes are performed to define the depicted via opening 43. In one embodiment, this etching process stops on the layer of material 12. After the via opening 43 is formed, the mask layer 41 may be removed.

Thereafter, as shown in FIG. 1O, one or more etching processes are performed to define the trench 45 in the layer of insulating material 14. Note that, in the depicted example, the trench 45 is formed without forming another etch mask above the device 100. During this etching process, portions of the layers 35 and 37 that are positioned at a level that is above the upper surface of the hard mask 31A are consumed. After the trench 45 is formed, the etching chemistry may be changed, if needed, to etch through the barrier layer 12 so as to thereby expose the underling conductive structure 18.

Next, as shown in FIG. 1P, one or more layers of conductive material are formed in the via 43 and the trench 45 using known techniques. So as not to obscure the present inventions, various details and layers associated with the formation of the conductive structure 50 are not depicted in the drawings. For example, one or more barrier layers (not shown) are typically formed in the via 43 and the trench 45 prior to overfilling the trench with a conductive material, e.g., copper. One or more CMP processes are then performed to remove any excess amounts of the conductive material used in forming the conductive structure 50, and all material positioned at a level above the upper surface of the layer of insulating material 14. Thereafter, a second non-conductive diffusion barrier layer 12 is formed above the device 100 to complete the fabrication of the metallization layer 23. The second non-conductive diffusion barrier layer 12 will help prevent or at least reduce any undesirable migration of the conductive materials in the conductive structure 50 and/or the top electrode 31B of the serial capacitor 60. In one illustrative embodiment, the second non-conductive diffusion barrier layer 12 may be a layer of NBLoK™ having a thickness of about 20-40 nm that is initially formed by performing a CVD process.

As shown in FIG. 1P, the novel serial capacitor 60 is comprised of the lower or bottom electrode 20A, the middle electrode 26A and the top electrode 31B. In the depicted embodiment, portions of the barrier layer 12 act as lower dielectric layer of the capacitor 60, i.e., the dielectric material positioned between the bottom electrode 20A and the middle electrode 26A. Portions of the layer of insulating material 30 act as the upper dielectric layer of the serial capacitor 60, i.e., the dielectric material positioned between the middle electrode 26A and the top electrode 31B. As described previously, the top electrode 31B and the bottom electrode 20A are conductively coupled to one another via the conductive structures 33. As will be recognized by those skilled in the art after a complete reading of the present application, the novel serial capacitor 60 may be formed at any level of the device 100. Moreover, in the illustrative process flow described above, portions of the layer 30 and the metal layer 31 are used in both the logic and capacitor regions of the device 100, thereby saving processing time and cost. More specifically, in the depicted process flow, portions of the layer 30 serve as an etch stop layer when forming the opening 39 in the hard mask layer 31A (see FIG. 1M), while other portions of the layer 30 serve as the upper dielectric layer in the serial capacitor 60 (see FIGS. 1M and 1P). In a similar vein, in the depicted process flow, portions of the conductive layer 31 serves as a metal hard mask layer 31A in the logic regions (see FIG. 1M), while other portions of the conductive layer 31, e.g., the portion 31B, serves as the upper electrode 31B in the serial capacitor 60 (see FIGS. 1M and 1P).

According to some aspects of the present invention, the lower electrode 20A, the upper electrode 31B and the middle electrode 26A may all be made of the same or different materials. For example, in some cases, all of the electrodes 20A, 26A and 31B may be made of titanium, titanium nitride, tantalum or tantalum nitride, but all of the electrodes need not be made of the same material from that group. In other cases, the bottom electrode 20A may be made of copper, while the middle electrode 26A and the top electrode 31B may be made of, for example, titanium, titanium nitride, tantalum or tantalum nitride, but the middle electrode 26A and the top electrode 31B need not be made of the same material from that group of materials. Similarly, in some cases, the lower dielectric layer, e.g., layer 12, may be made from a different material than that of the upper dielectric layer 30, wherein, in other cases, the lower dielectric layer, e.g., layer 12, may be made of the same material as that of the upper dielectric layer 30. According to yet other aspects of the inventions disclosed herein, the bottom electrode 20A and the lower dielectric layer 12 are formed in the metallization layer 21 of the integrated circuit product 100, while the middle electrode 26A, the top electrode 31B and the upper dielectric layer 30 are formed in the metallization layer 23 that is positioned above the metallization layer 21.

Figure 2A:
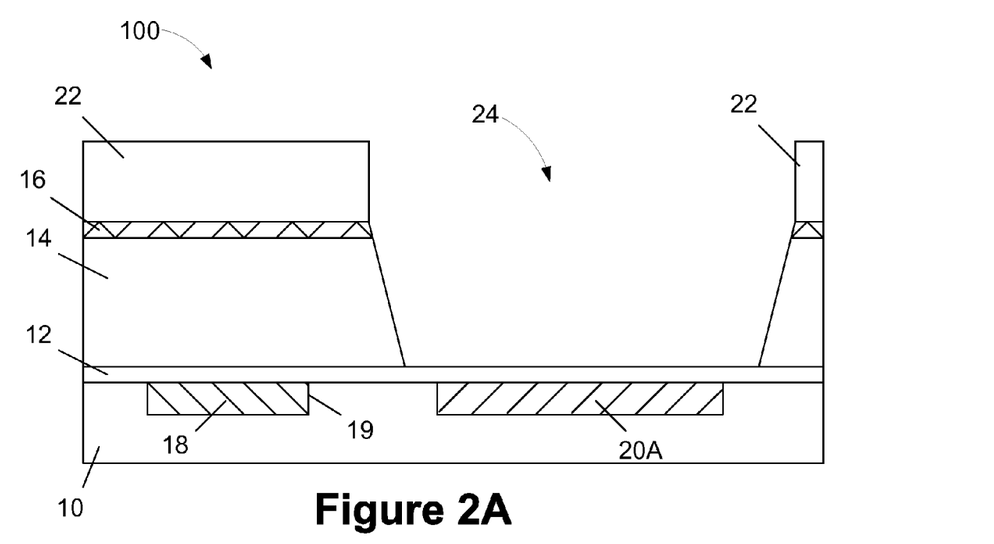
FIGS. 2A-2E depict yet another illustrative method of forming another illustrative embodiment of a high density serial capacitor device described herein.
Figure 2B:
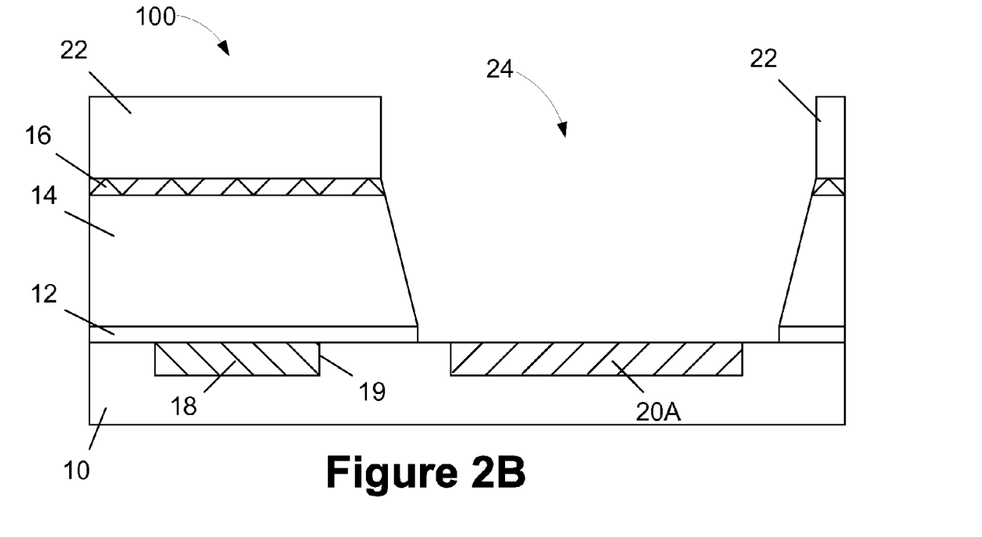

FIGS. 2A-2E depict yet another illustrative process flow disclosed herein for forming another embodiment of a serial capacitor. FIG. 2A depicts the device 100 at a point of fabrication that corresponds approximately to that shown in FIG. 1B. FIG. 2B depicts the device 100 after an etching process has been performed to remove portions of the barrier layer 12 exposed by the opening 24. Removal of portions of the barrier layer 12 also exposes the conductive structure 20A.

Figure 2C:
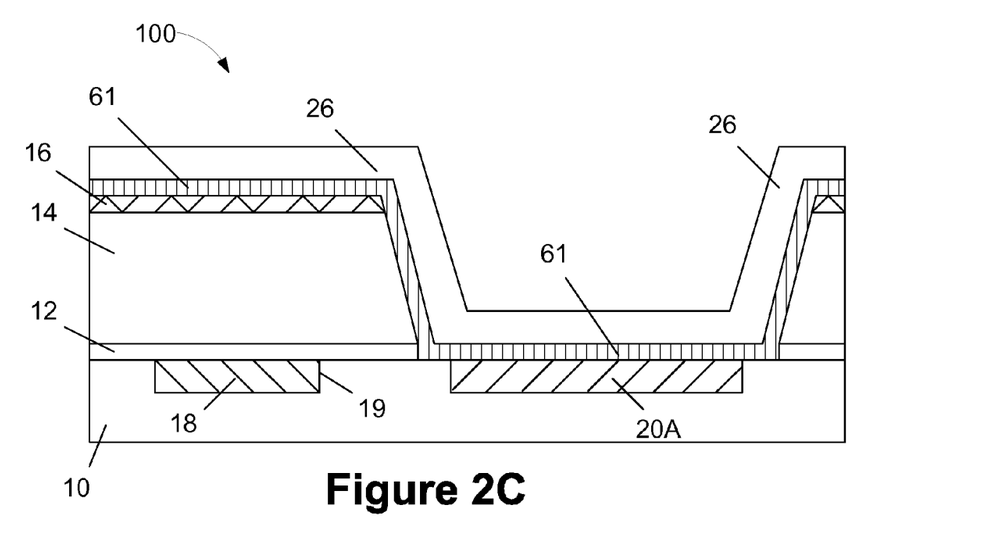

FIG. 2C depicts the device 100 after several process operations have been performed on the device 100. Initially, a layer of insulating material 61 is conformally deposited above the device 100 and on the exposed conductive structure 20A. In one illustrative embodiment, the layer of insulating material 61 may be comprised of a variety of materials such as, for example, a TEOS-based silicon dioxide, silicon nitride, etc. In one specific example, the layer of insulating material 61 may be a layer of TEOS-based silicon dioxide or silicon nitride, etc., having a thickness of about 20-50 nm that is initially formed by performing a CVD process. In general, within logic circuits of the device 100, the layer of insulating material 61 may serve as a hard mask layer, while within the capacitor sections of the device 100, portions of the layer of insulating material 61 will serve as the dielectric layer between the bottom electrode 20A and the middle electrode 26A of the serial capacitor 60 (see FIG. 2E). It should also be noted that, so as to serve its hard mask function in the logic region, the layer of insulating material 61 may be made of a material such that it exhibits an increased hardness relative to the hardness of the hard mask layer 16. With continuing reference to FIG. 2C, the previously described conductive material layer 26 has also been formed above the device 100 and on the layer of insulating material 61. As before, a portion of the conductive material layer 26 will eventually become the middle electrode 26A for the serial capacitor 60.

Figure 2D:
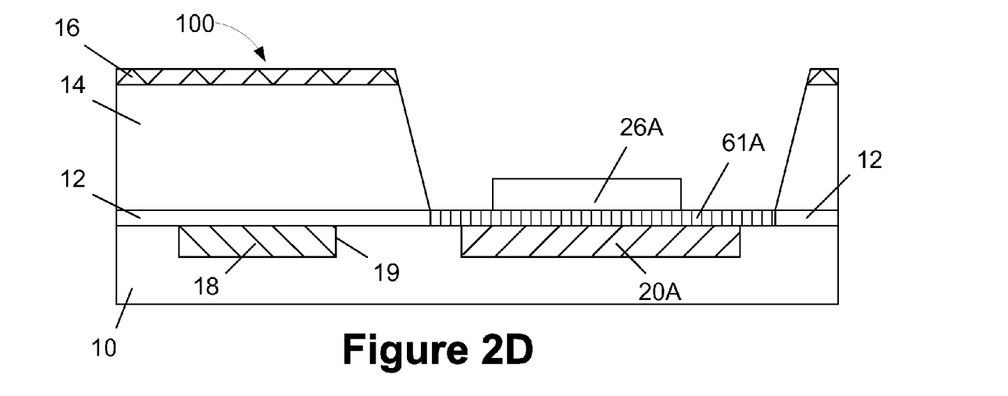
Figure 2E:
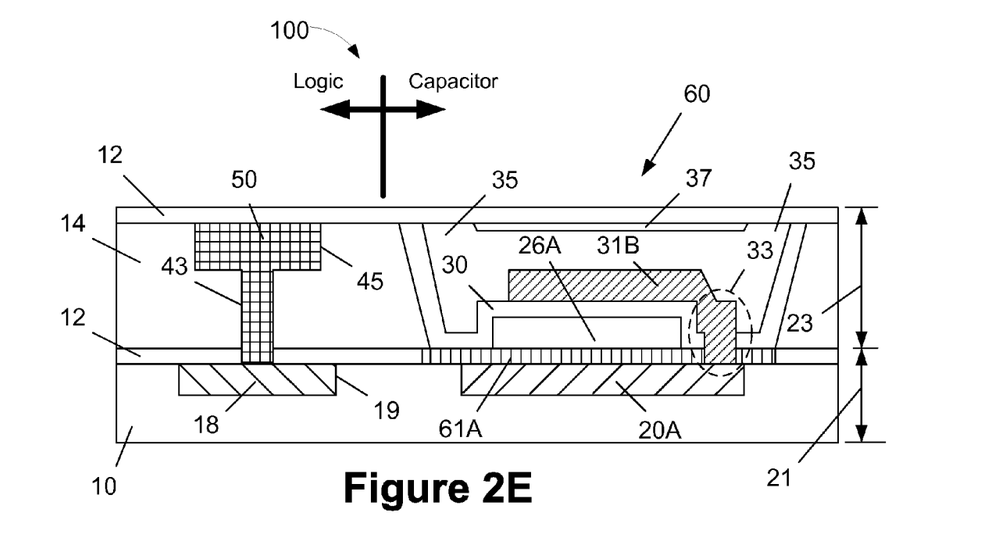

FIG. 2D depicts the device 100 after one or more etching processes have been performed on the conductive material layer 26 and the layer of insulating material 61 through one or more patterned mask layers (not shown) to define the middle electrode 26A and the lower dielectric layer 61A (positioned between the lower electrode 20A and the middle electrode 26A) of the serial capacitor 60. Either dry or wet etching processes may be employed in these etching processes. FIG. 2D depicts the device 100 after all patterned mask layers have been removed. At the point of processing depicted in FIG. 2D, the processing operations described in FIGS. 1E-1P may be performed to arrive at the structure depicted in FIG. 2E wherein the portion 61A of the layer of insulating material 61 serves as the bottom dielectric layer in the serial capacitor 60.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a capacitor comprising a plurality of elements including a bottom electrode, a top electrode, a middle electrode, a lower dielectric layer and an upper dielectric layer;
   forming the bottom electrode and a first conductive structure in a first layer of insulating material, said first conductive structure and said bottom electrode being laterally spaced apart and electrically isolated from one another in said first layer of insulating material;
   using a process layer patterned to define at least one of the elements of the capacitor as a hard mask above said first conductive structure during at least one etch process;
   forming a first contact conductively coupling said top electrode to said bottom electrode; and
   forming a second contact conductively coupled to said first conductive structure.

2. The method of claim 1, wherein the process layer comprises the first dielectric layer, and the etch process comprises an etch process to pattern a conductive material layer to define the middle electrode.

3. The method of claim 1, wherein the process layer comprises a conductive material layer patterned to define the top electrode and an opening above the first conductive structure, and the etch process comprises an etch process to define an opening in the first insulating layer exposing the first conductive structure.

4. The method of claim 3, further comprising:
   forming a first portion of the first dielectric layer above the first conductive structure and a second portion of the first dielectric layer above the lower electrode; and
   patterning a conductive material layer formed above the first dielectric layer to define the middle electrode using the first dielectric layer as a hard mask above the first conductive feature.

5. The method of claim 1, wherein at least one of said bottom electrode, said top electrode and said middle electrode are comprised of titanium, titanium nitride, tantalum, or tantalum nitride.

6. The method of claim 1, wherein said bottom electrode is comprised of copper, and said middle and top electrodes are comprised of one of titanium, titanium nitride, tantalum, or tantalum nitride.

7. A method, comprising:
   forming a first conductive structure and a bottom electrode of a capacitor in a first layer of insulating material, said first conductive structure and said bottom electrode being laterally spaced apart and electrically isolated from one another in said first layer of insulating material;
   forming a middle electrode of said capacitor above said bottom electrode, said middle electrode being positioned in a second layer of insulating material that is positioned above said first layer of insulating material;
   forming an upper dielectric layer of said capacitor above said middle electrode and above said second layer of insulating material;
   forming a layer of conductive material above said upper dielectric layer;
   performing an etching process on said layer of conductive material to define a conductive material hard mask and a top electrode for said capacitor, said conductive material hard mask being positioned above at least a portion of said first conductive structure and said top electrode being positioned above said middle electrode;
   forming an opening in said conductive material hard mask;
   performing an etching process through said conductive material hard mask on said second layer of insulating material to define a trench in said second layer of insulating material; and
   forming a second conductive structure that conductively contacts said first conductive structure, wherein at least a portion of said second conductive structure is at least partially positioned in said trench.

8. The method of claim 7, wherein forming said bottom electrode comprises forming said bottom electrode in a metallization layer of an integrated circuit product, and forming said middle electrode and said top electrode comprises forming said middle electrode and said top electrode in another metallization layer of said integrated circuit product that is positioned above said metallization layer.

9. The method of claim 7, wherein said bottom electrode and a lower dielectric layer of said capacitor are formed in a metallization layer of an integrated circuit product and said middle electrode, said top electrode and said upper dielectric layer are formed in another metallization layer of said integrated circuit product that is positioned above said metallization layer.

10. The method of claim 7, wherein a lower dielectric layer of said capacitor is a portion of an uppermost barrier layer of a metallization layer of an integrated circuit product and said middle electrode, said top electrode and said upper dielectric layer are formed in another metallization layer of said integrated circuit product that is positioned above said metallization layer.

11. The method of claim 7, wherein at least one of said bottom electrode, said top electrode and said middle electrode are comprised of titanium, titanium nitride, tantalum, or tantalum nitride.

12. The method of claim 7, wherein said bottom electrode is comprised of copper, and said middle and top electrodes are comprised of one of titanium, titanium nitride, tantalum, or tantalum nitride.

13. The method of claim 7, further comprising forming a lower dielectric layer across an entire upper surface of said first layer of insulating material and on said bottom electrode.

14. The method of claim 7, wherein, prior to forming said middle electrode, the method further comprises:
   forming a barrier layer across an entire upper surface of said first layer of insulating material;
   removing a portion of said barrier layer to thereby expose said bottom electrode; and
   depositing a lower dielectric layer of said capacitor on said exposed bottom electrode.

15. A method, comprising:
   forming a first conductive structure and a bottom electrode of a capacitor in a first layer of insulating material, said first conductive structure and said bottom electrode being laterally spaced apart and electrically isolated from one another in said first layer of insulating material;

forming a barrier layer above said first conductive structure and said bottom electrode;

removing a first portion of said barrier layer aboce said bottom electrode, a second portion of said barrier layer remaining above said first conductive structure;

forming a lower dielectric layer of said capacitor above said bottom electrode and said second portion of said barrier layer after removing said portion of said barrier layer;

forming a first conductive material layer above said lower dielectric layer;

patterning said first conductive material layer using said lower dielectric layer as a hard mask above said first conductive structure to define a middle electrode of said capacitor above said bottom electrode, said middle electrode being positioned in a second layer of insulating material that is positioned above said first layer of insulating material;

forming an upper dielectric layer of said capacitor above said middle electrode and above said conduct structure;

after forming said upper dielectric layer, performing an etching process to define at least one first opening that exposes a portion of said bottom electrode;

forming a second conductive material layer above said upper dielectric layer;

patterning said second conductive material layer to define a second opening in said second conductive layer above said first conductive structure and to define a top electrode of said capacitor above said upper dielectric layer, wherein a portion of said top electrode extends through said at least one first opening and is conductively coupled to said exposed portion of said bottom electrode and wherein said top electrode is positioned in said second layer of insulating material;

forming a third opening in said second layer of insulating material and said second portion of said barrier layer to expose said first conductive structure using said second conductive material layer above said first conductive structure as a hard mask; and forming a second conductive structure in said third opening that conductively contacts said first conductive structure.

16. The method of claim 15, wherein forming said bottom electrode comprises forming said bottom electrode in a metallization layer of an integrated circuit product, and forming said middle electrode and said top electrode comprises forming said middle electrode and said top electrode in another metallization layer of said integrated circuit product that is positioned above said metallization layer.

17. The method of claim 15, wherein said bottom electrode and said lower dielectric layer are formed in a metallization layer of an integrated circuit product and said middle electrode, said top electrode and said upper dielectric layer are formed in another metallization layer of said integrated circuit product that is positioned above said metallization layer.

18. The method of claim 15, wherein at least one of said bottom electrode, said top electrode, and said middle electrode are comprised of titanium, titanium nitride, tantalum, or tantalum nitride.

19. The method of claim 15, wherein said bottom electrode is comprised of copper and said middle and top electrodes are comprised of one of titanium, titanium nitride, tantalum, or tantalum nitride.

20. The method of claim 15, wherein said lower dielectric layer is comprised of one of silicon nitride, NBLoK™, silicon carbon nitride, or a nitrogen-doped silicon carbide.

21. The method of claim 15, wherein forming said lower dielectric layer comprises forming said lower dielectric layer across an entire upper surface of said first layer of insulating material.

* * * * *

UNITED STATES PATENT AND TRADEMARK OFFICE
CERTIFICATE OF CORRECTION

PATENT NO.        : 8,809,149 B2
APPLICATION NO.   : 13/712234
DATED             : August 19, 2014
INVENTOR(S)       : Lee et al.

Page 1 of 1

It is certified that error appears in the above-identified patent and that said Letters Patent is hereby corrected as shown below:

In the Claims

Claim 15, column 13, line 3, delete "aboce" and insert therefor -- above --.

Claim 15, column 13, line 20, delete "conduct" and insert therefor -- first conductive --.

Signed and Sealed this
Ninth Day of December, 2014

Michelle K. Lee
*Deputy Director of the United States Patent and Trademark Office*